(12) United States Patent
Chen et al.

(10) Patent No.: US 6,194,266 B1
(45) Date of Patent: Feb. 27, 2001

(54) METHOD FOR FORMING A CAPACITOR HAVING SELECTIVE HEMISPHERICAL GRAINED POLYSILICON

(75) Inventors: Terry Chung-Yi Chen, Taipei; Cheng-Chih Kung, Miao-Li; Da-Wen Hsia, Taipei; Cheng-Chieh Huang, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/511,656

(22) Filed: Feb. 22, 2000

(51) Int. Cl.[7] .................................................. H01L 21/8242
(52) U.S. Cl. .......................... 438/255; 438/398; 438/964
(58) Field of Search .................................. 438/239, 253, 438/254, 255, 396, 397, 398, 482, 657, 665, 964

(56) References Cited

U.S. PATENT DOCUMENTS

| | | | |
|---|---|---|---|
| 5,639,685 | * 6/1997 | Zahurak et al. | 437/60 |
| 5,877,052 | * 3/1999 | Lin et al. | 438/238 |
| 5,897,352 | * 4/1999 | Lin et al. | 438/255 |
| 5,943,584 | * 8/1999 | Shim et al. | 438/398 |
| 5,963,804 | * 10/1999 | Figura et al. | 438/255 |
| 6,066,529 | * 5/2000 | Lin et al. | 438/255 |

\* cited by examiner

*Primary Examiner*—Tuan H. Nguyen
*Assistant Examiner*—Jack Chen

(57) ABSTRACT

A method for forming a capacitor containing selective hemispherical grained (S-HSG) polysilicon is disclosed. In this invention, dopant implantation is incorporated after the S-HSG growth to replace conventional wet clean procedure. The elimination of the cleaning treatments avoids the incidents of residue particles (due to cleaning) and minimizes numerous structure defects. The incorporation of the ion implantation technique would make up the insufficiency of doping requirement by applying in-diffusion alone. The combination of the in-diffusion and the implantation for doping procedure could maintain the device with good capacitance level even though the pre-clean procedure is excluded.

16 Claims, 1 Drawing Sheet

METHOD FOR FORMING A CAPACITOR HAVING SELECTIVE HEMISPHERICAL GRAINED POLYSILICON

BACKGROUND OF THE INVENTION

1. Field of the Invention

The present invention relates to a method for fabricating a capacitor for dynamic random access memory (DRAM) device, and more particularly, a method for forming selective hemispherical grained polysilicon of the capacitor.

2. Description of the Prior Art

The continuing trend of scaling down integrated circuits has forced the semiconductor industry to consider new techniques for fabricating precise components at sub-micron levels. Along with the need for smaller components, there has been a growing demand for capacitors having increased capacitance and reduced feature widths.

With respect to dynamic memory devices, storage node capacitor cell plates must be sufficiently large to retain an adequate charge. This is particularly significant when taking device noise and parasitic effects into account. As density of semiconductor devices, such as DRAM arrays, has continued to increase with industry trends, the issue of maintaining storage node capacitance has grown in importance.

In light of the above demands, several techniques have been proposed to increase the capacitance of capacitors without effecting the cell area. These techniques have included utilizing trench and stacked capacitor structures, as well as new dielectric material having increased dielectric constants Another approach for increasing capacitance while reducing feature size known in the art is the formation of roughened polysilicon film, such as hemispherical grained (HSG) polysilicon, as a capacitor storage node. Fundamentally, by relying on roughened polysilicon, a larger surface area is formed for the same planar area that is available for the capacitor. Given the advantages of enhanced capacitance, selective hemispherical grained (S-HSG) polysilicon has been widely employed in storage node processing of DRAM fabrication. This S-HSG structure is utilized to increase surface areas of lower electrode plate (usually polysilicon) so that the electrode layout can be shrunk as well as the whole chip size.

Formation of an S-HSG node typically includes S-HSG growth, in-diffusion (annealing), and dielectric (e.g. ONO, oxide-nitride-oxide) depositions. Cleaning in-between the main process steps is additionally applied as required. However, since S-HSG is quite sensitive to cleaning procedures, defects are easily made during such treatments, and thus influence electrical yield of the product. One solution known to minimize the defects is the adaptation of so-called in-situ (performed HSG process without leaving the same chamber) fabrication.

In case in-situ (one-chamber) process was not accessible by the existing facilities, conventional multi-furnaces (ex-situ process) would be used. The ex-situ S-HSG process normally includes some wet cleaning steps (e.g. DHF, dilute hydrofluoric acid, process) for post-treating of the amorphous S-HSG before the dopant in-diffusion step. The wet clean herein is mainly to remove native oxide on the S-HSG silicon layer. Besides, it serves to make subsequent dopant in-diffusion efficient while attaining flowing silicon surface migration and enlarging surface area of the S-HSG. However, this wet cleaning has several shortcomings. One particular failing is the necking of the grains (e.g. grain 101), as indicated in FIG. 1, due to excess silicon migration of the HSG. The cleaning also weakens the connections of the HSG (grains 102 and 103) to polysilicon 105 and causes some small grain particles (such as 102 in the figure) to depart from the silicon 105 surface. In addition, applications of the wet treatment often result in over-etching of the oxide layer 107 underneath the polysilicon nodes, and form defective portions, such as the one (109) indicated in the figure, of the structure. Severe defects of the kind could endanger the connections of the poly nodes to the oxide substrate. Furthermore, electrical shortage between adjacent nodes occasionally occurred during mass production of the product. Such occurrence is strongly related to the tiny residues left after the cleaning.

As such, there is a need for a method to reduce defect generations from the wet cleaning during ex-situ S-HSG process. The present invention suggests one to minimize opportunities of defect formation while still keeping up good capacitance level of the structure.

SUMMARY OF THE INVENTION

In accordance with the present invention, a method is provided for fabricating a capacitor with ex-situ formed selective hemispherical grained (S-HSG) polysilicon. In one embodiment, an undoped storage node electrode with a roughened amorphous selective hemispherical grained (S-HSG) polysilicon layer is formed on an insulting layer (the insulting layer is a part of a semiconductor substrate). Phosphine annealing is then applied to the structure for dopant in-diffusion of the S-HSG, followed by dopant (n-type) implantation of the S-HSG. However, the doping sequence can be switched. In another embodiment, the implantation would be proceeded prior to the in-diffusion process. After the doping procedure, the structure is treated with wet cleaning. Then a layer of capacitor dielectric and next a polysilicon layer is formed to conclude the construction of the capacitor.

In this invention, dopant implantation is incorporated after the S-HSG growth to replace the wet clean procedure. The elimination of the cleaning treatments avoids the incidents of residue particles (due to cleaning) and minimizes numerous structure defects. The incorporation of the ion implantation technique would make up the insufficiency of doping requirement by applying in-diffusion alone. The combination of the in-diffusion and the implantation for doping procedure could maintain the device with good capacitance level even though the pre-clean procedure is excluded.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The invention disclosed herein is directed to a method for forming selective hemispherical grained polysilicon (S-HSG) during the fabrication of a capacitor. In the following description, numerous details are set forth in order to provide a thorough understanding of the present invention. It will be appreciated by one skilled in the art that variation of these specific details are possible while still achieving the results of the present invention. In other instances, well-known processing steps are not described in detail in order not to unnecessarily obscure the present invention.

Figure 1:
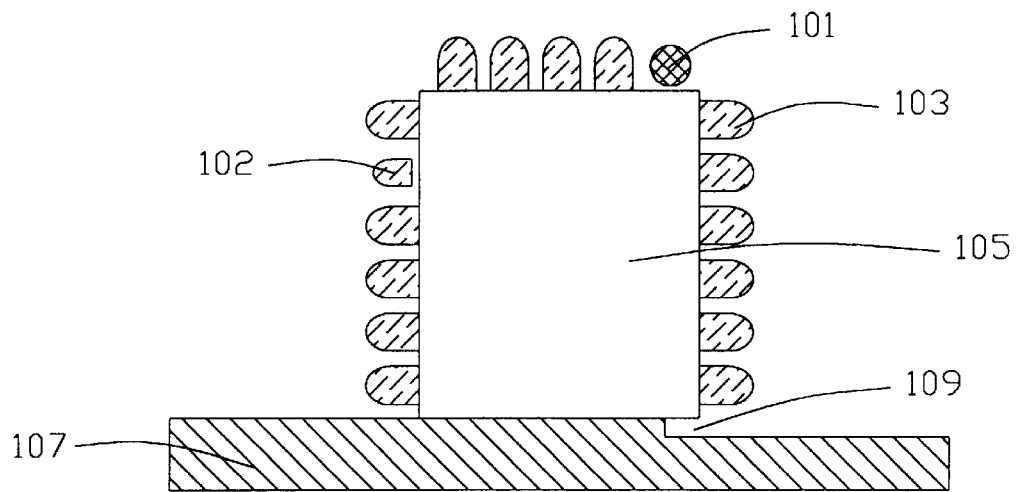
FIG. 1 is a cross-sectional perspective of a hemispherical grained structure of a capacitor, showing several defects resulted from conventional wet clean performed after HSG growth.
Figure 2:
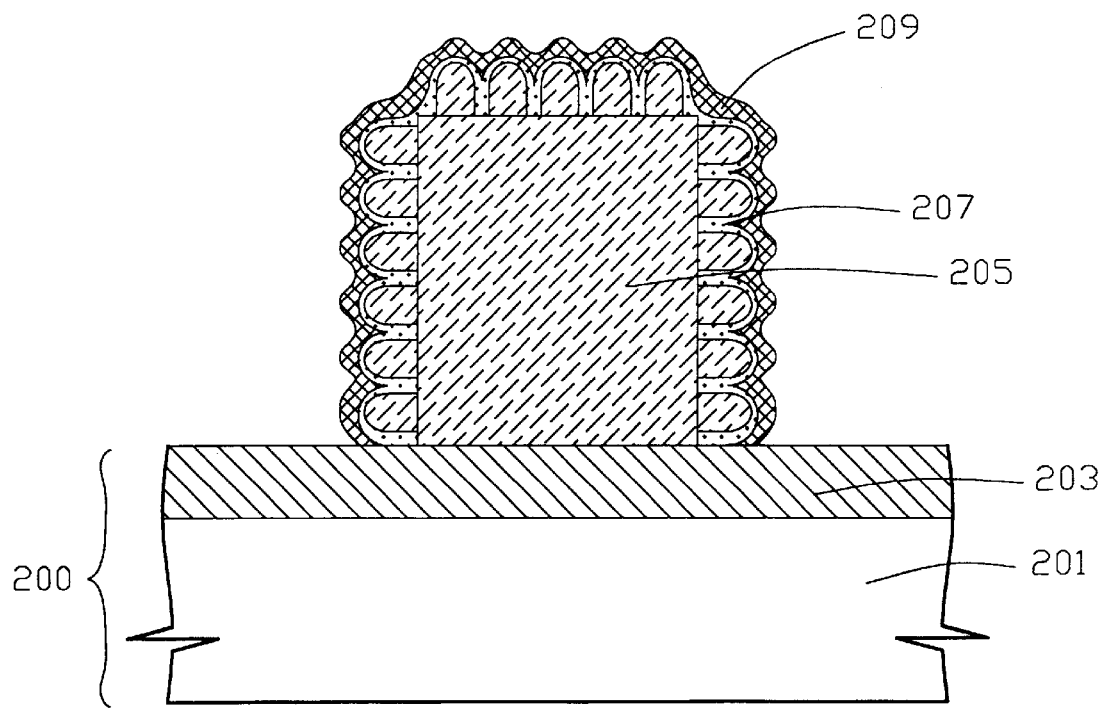
FIG. 2 is a cross-sectional view of a capacitor with hemispherical grained silicon as a lower electrode according to one embodiment of the invention.

Referring now to FIG. 2, a semiconductor substrate 200 is initially provided. Substrate 200 comprises a polysilicon layer 201 and an insulting layer 203. The insulating layer preferably comprises silicon oxide. An undoped storage node electrode 205 with a roughened amorphous selective hemispherical grained (S-HSG) silicon layer is formed on the insulting layer 203. To avoid large depletion effect cross the node capacitor, it is essential to push dopants into the undoped S-HSG. Phosphine ($PH_3$) is chosen to be a dopant of our embodiments. In one embodiment, phosphine annealing is now applied to the structure for dopant in-diffusion of the HSG, followed by dopant (n-type) implantation of the S-HSG. The temperature for phosphine annealing is preferred to be between about 600 to 750° C., and the annealing time can be about 30 minutes. The dose for dopant implantation is preferred to be $1 \times 10^{15}$ $cm^{-2}$. However, the doping sequence can be switched. In another embodiment, the implantation would be proceeded prior to the in-diffusion process. After the doping procedure, the S-HSG should have been poly-crystallized. The structure is then treated with wet cleaning. Then a layer of capacitor dielectric 207 is formed on the S-HSG silicon layer. At last, a polysilicon layer 209 is deposited on the capacitor dielectric layer as an upper electrode of the capacitor. After defining the upper electrode, the construction of the capacitor is concluded.

The present inventive methods are typically ex-situ performed. Several furnaces are generally required for completing the process. In this invention, dopant implantation is incorporated after the S-HSG growth to replace the wet clean procedure. The elimination of the cleaning treatments avoids the incidents of residue particles (due to cleaning) and minimizes numerous structure defects. Since annealing temperature and diffusion time are both limited during device fabrication, the in-diffusion of dopant is constricted by thermal budgets of the process, and thus an annealing-only (without the pre-treated cleaning to facilitate the diffusion surface) process could make S-HSG doping insufficient. The incorporation of the ion implantation technique herein would make up the insufficiency of the doping requirement. By the way, the applications of dopant implantation alone (without in-diffusion) could cause devices to suffer depletion effect especially for the ones with high aspect ratio. It is difficult for the implanted ion to reach the bottom of the nods, and becomes even harder as the node increases in height. Thus the combination of the in-diffusion and the implantation for doping procedure is used to maintain capacitance level while skipping the pre-clean procedure.

Although specific embodiments have been illustrated and described, it will be obvious to those skilled in the art that various modifications may be made without departing from what is intended to be limited solely by the appended claims.

What is claimed is:

1. A method for fabricating a capacitor for a DRAM device, comprising:

providing a semiconductor substrate, said semiconductor substrate comprises a polysilicon layer having an insulating layer disposed thereon;

forming an undoped storage node upon said insulating layer as a lower electrode of the capacitor, wherein said undoped storage node comprises amorphous selective hemispherical grained (S-HSG) silicon layer;

annealing said undoped storage node under an ambience having first dopant for dopant in-diffusion;

implanting said undoped storage node with second dopant;

performing a wet clean procedure after the implanting step;

forming a capacitor dielectric layer on said lower electrode; and forming a polysilicon layer on said capacitor dielectric layer as an upper electrode of the capacitor.

2. The method according to claim 1, wherein said insulting layer comprises silicon oxide.

3. The method according to claim 1, wherein said first dopant comprises n-type dopant.

4. The method according to claim 3, wherein said first dopant comprises phosphine ($PH_3$).

5. The method according to claim 4, wherein said annealing is carried out at a temperature between about 600° C. to about 750° C.

6. The method according to claim 5, wherein said annealing is carried out at about 30 minutes.

7. The method according to claim 1, wherein said second dopant comprises n-type dopant.

8. The method according to claim 7, wherein the implantating for said n-type dopant is about $1 \times 10^{15}$ $cm^{-2}$.

9. The method according to claim 1, wherein said capacitor dielectric layer comprises oxide-nitride-oxide (ONO) layer.

10. The method according to claim 1, wherein said lower electrode is ex-situ formed.

11. A method for fabricating a capacitor containing ex-situ formed selective hemispherical grained (S-HSG) polysilicon, comprising:

providing a semiconductor substrate, said semiconductor substrate comprises a polysilicon layer having an insulating layer disposed thereon;

forming an undoped storage node upon said insulating layer as a lower electrode of the capacitor, wherein said undoped storage node comprises amorphous selective hemispherical grained (S-HSG) silicon;

phosphine annealing said undoped storage node for dopant in-diffusion;

implanting said undoped storage node with n-type dopants;

performing a wet clean procedure after the implanting step;

forming a capacitor dielectric layer on said lower elecrtrode; and forming a polysilicon layer on said capacitor dielectric layer as an upper electrode of the capacitor.

12. The method according to claim 11, wherein said insulting layer comprises silicon oxide.

13. The method according to claim 11, wherein said capacitor dielectric layer comprises oxide-nitride-oxide (ONO) layer.

14. A method for fabricating a capacitor containing ex-situ formed selective hemispherical grained (S-HSG) polysilicon, comprising:

providing a semiconductor substrate, said semiconductor substrate comprises a polysilicon layer having an insulating layer disposed thereon;

forming an undoped storage node upon said insulating layer as a lower electrode of the capacitor, wherein said undoped storage node comprises amorphous selective hemispherical grained (S-HSG) silicon;

implanting said undoped storage node with n-type dopants;

phosphine annealing said undoped storage node for dopant in-diffusion;

performing a wet clean procedure after the phosphine annealing step;

forming a capacitor dielectric layer on said lower electrode; and forming a polysilicon layer on said capacitor dielectric layer as an upper electrode of the capacitor.

15. The method according to claim 14, wherein said insulting layer comprises silicon oxide.

16. The method according to claim 14, wherein said capacitor dielectric layer comprises oxide-nitride-oxide (ONO) layer.

* * * * *